(12) United States Patent
Ahn et al.

(10) Patent No.: US 9,886,340 B2
(45) Date of Patent: Feb. 6, 2018

(54) MEMORY SYSTEM AND METHOD FOR ERROR CORRECTION OF MEMORY

(71) Applicants: SEOUL NATIONAL UNIVERSITY R&DB FOUNDATION, Seoul (KR); WISCONSIN ALUMNI RESEARCH FOUNDATION, Madison, WI (US)

(72) Inventors: Jung Ho Ahn, Suwon-si (KR); Namsung Kim, Champaign, IL (US)

(73) Assignees: SEOUL NATIONAL UNIVERSITY R&DB FOUNDATION, Seoul (KR); WISCONSIN ALUMNI RESEARCH FOUNDATION, Madison, WI (US)

( * ) Notice: Subject to any disclaimer, the term of this patent is extended or adjusted under 35 U.S.C. 154(b) by 0 days.

(21) Appl. No.: 15/059,102

(22) Filed: Mar. 2, 2016

(65) Prior Publication Data

US 2017/0091025 A1    Mar. 30, 2017

(30) Foreign Application Priority Data

Sep. 30, 2015 (KR) ........................ 10-2015-0138269

(51) Int. Cl.
*G06F 11/10* (2006.01)
*G06F 3/06* (2006.01)
*H03M 13/29* (2006.01)
*H03M 13/19* (2006.01)

(52) U.S. Cl.
CPC .......... *G06F 11/1024* (2013.01); *G06F 3/064* (2013.01); *G06F 3/0619* (2013.01); *G06F 3/0679* (2013.01); *G06F 11/1048* (2013.01); *H03M 13/2909* (2013.01); *H03M 13/2927* (2013.01); *H03M 13/19* (2013.01)

(58) Field of Classification Search
CPC .................................................. G06F 11/1024
See application file for complete search history.

(56) References Cited

U.S. PATENT DOCUMENTS

| | | | | |
|---|---|---|---|---|
| 4,175,692 A | * | 11/1979 | Watanabe | G06F 11/1024 714/15 |
| 5,233,614 A | * | 8/1993 | Singh | G06F 11/1044 714/702 |
| 5,438,573 A | * | 8/1995 | Mangan | G06F 3/0601 714/701 |

(Continued)

FOREIGN PATENT DOCUMENTS

| KR | 10-2014-0005757 A | 1/2014 |
|---|---|---|
| KR | 10-2014-0125981 A | 10/2014 |

*Primary Examiner* — Steve Nguyen
(74) *Attorney, Agent, or Firm* — Korus Patent, LLC; Seong Il Jeong

(57) ABSTRACT

A memory system and a method for the error correction of memory are disclosed herein. The method for the error correction of memory is performed by a memory system including a plurality of memory chips. The method for the error correction of memory may include reading, by a first ECC engine unit included in each of a plurality of memory chips, a chunk including a plurality of data bursts, first parity bits, and position bits from each of the plurality of memory chips; extracting, by the first ECC engine unit, a single data burst having an error from the plurality of data bursts using the position bits; and performing, by the first ECC engine unit, first error correction using the first parity bit corresponding to the extracted error data burst.

13 Claims, 4 Drawing Sheets

(56) References Cited

U.S. PATENT DOCUMENTS

| | | | | |
|---|---|---|---|---|
| 5,883,903 | A * | 3/1999 | Higashitani | G06F 11/1008 714/710 |
| 6,339,546 | B1 * | 1/2002 | Katayama | G06F 11/1008 365/185.09 |
| 7,467,337 | B2 * | 12/2008 | Nakamura | G11C 29/42 714/704 |
| 8,086,913 | B2 * | 12/2011 | Houg | G11C 29/76 714/710 |
| 8,572,444 | B2 * | 10/2013 | Lee | G06F 11/1048 714/719 |
| 8,949,690 | B2 * | 2/2015 | Sugahara | G06F 11/1048 714/764 |
| 2009/0132876 | A1 * | 5/2009 | Freking | G06F 11/106 714/723 |
| 2010/0281341 | A1 * | 11/2010 | Wu | H03M 13/2909 714/763 |
| 2011/0252284 | A1 * | 10/2011 | Sindhu | G06F 11/1008 714/722 |
| 2013/0305123 | A1 | 11/2013 | Billing et al. | |
| 2015/0270015 | A1 * | 9/2015 | Murphy | G11C 29/18 714/723 |

* cited by examiner

MEMORY SYSTEM AND METHOD FOR ERROR CORRECTION OF MEMORY

This invention was made with government support under 1016262 awarded by the National Science Foundation and HR0011-12-2-0019 awarded by the DOD/DARPA. The government has certain rights in the invention.

BACKGROUND

1. Technical Field

The present invention relates generally to a memory system and a method for the error correction of memory, and more particularly to a memory system and a method for the error correction of memory that can improve the reliability and performance of the memory system.

This application claims priority of Korean Patent Application No. 10-2015-0138269 filed on Sep. 30, 2015, the entire contents of which is incorporated herein by reference.

2. Description of the Related Art

Recently, as the process scaling of Dynamic Random Access Memory (DRAM) continues to increase, a tendency for an error to occur in a memory cell increases. DRAM is memory that has finite data retention characteristics. Accordingly, as the process scaling of DRAM increases, the reliability of data stored in a memory cell decreases.

Furthermore, as the cell failure rate increases, conventional solutions, such as the addition of reserved repair resources and reliance on error-correcting code (ECC), have problems in that high area overhead, the disadvantage of the latency of data coding, and interference between in-DRAM ECC (ECC within a DRAM chip) and rank-level ECC (ECC across DRAM chips) occur.

As a result, there is a need for technology that is capable of overcoming the above-described problems.

Meanwhile, the above-described background technologies correspond to technical information that has been possessed by the present inventor in order to devise the present invention or that has been acquired in the process of devising the present invention, and cannot be necessarily viewed as well-known technology that had been known to the public before the filing of the present invention.

SUMMARY

At least one embodiment of the present invention is intended to prevent interference between in-DRAM ECC and rank-level ECC.

At least one embodiment of the present invention is intended to reduce the area overhead of a memory chip to which ECC is applied.

At least one embodiment of the present invention is intended to provide a memory system that can improve the reliability of memory.

In accordance with an aspect of the present invention, there is provided a memory system including at least one memory chip, wherein the at least one memory chip includes: a bank comprising a data bit array comprising a plurality of first memory cells, and a first parity array comprising a plurality of second memory cells, and configured to store first parity bits, adapted to repair one or more faulty cells of the first memory cells within the data bit array, in the plurality of second memory cells; a position bit region comprising a position bit array comprising a plurality of third memory cells, and configured to store position bits, i.e., the location information of the faulty cells of the plurality of first memory cells within the data bit array; and a first ECC engine unit configured to compare an address, applied from the outside, with the position bits read from the position bit region with respect to a chunk including a plurality of data bursts read from the data bit array, to detect a single error data burst from the plurality of data bursts included in the chunk, and to perform first error correction on the detected data burst.

In accordance with another aspect of the present invention, there is provided a method for the error correction of memory, the method being performed by a memory system including a plurality of memory chips, the method including: reading, by a first ECC engine unit included in each of the plurality of memory chips, a chunk including a plurality of data bursts, first parity bits, and position bits from each of the plurality of memory chips; extracting, by the first ECC engine unit, a single data burst having an error from the plurality of data bursts using the position bits; and performing, by the first ECC engine unit, first error correction using the first parity bit corresponding to the extracted error data burst.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
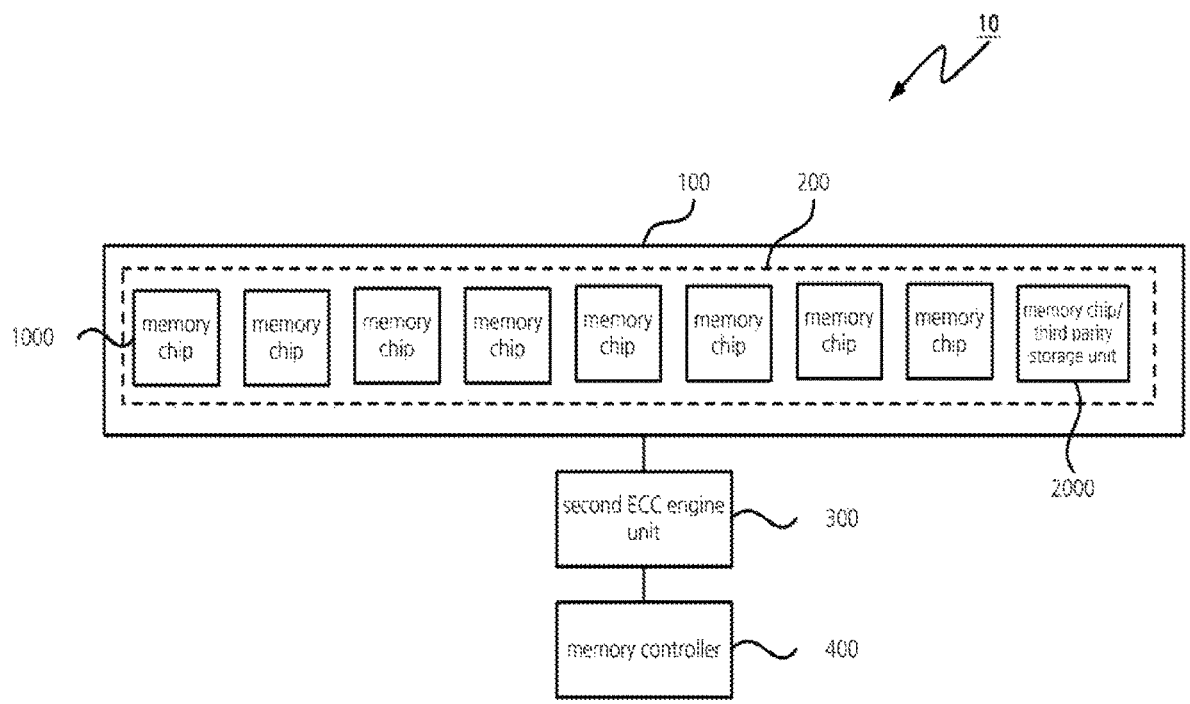
FIG. 1 is a block diagram showing a memory system according to an embodiment of the present invention.

Embodiments of the present invention will be described in detail with reference to the accompanying drawings in order to enable those having ordinary knowledge in the technical field, to which the present invention pertains, to easily practice the present invention. However, the present invention may be implemented in various forms, and is not limited to embodiments described herein. Furthermore, in order to clearly illustrate the present invention in the drawings, components and portions unrelated to the following description will be omitted. Throughout the specification, similar reference symbols will be assigned to similar components.

Throughout the specification and the claims, when one component is described as being "connected" to another component, the one component may be "directly connected" to the other component or "electrically connected" to the other component via a third component. Throughout the specification and the claims, unless explicitly described to the contrary, the terms "include" and "comprise" and their variants, such as "includes," "including," "comprises" and "comprising," will be understood to imply the inclusion of described components, not the exclusion of any other components.

The present invention will be described in detail below with reference to the accompanying diagrams.

FIG. 1 is a block diagram showing a memory system 10 according to an embodiment of the present invention.

The memory system 10 according to an embodiment of the present invention may include a memory module 100, a second ECC engine unit 300, and a memory controller 400. The memory module 100 may include one or more memory chips 1000.

The memory controller memory controller 400 may control the general operation of the memory system 100, and may interface with the memory chips 1000. For example, the memory controller 400 reads and writes data by controlling the memory chips 1000.

Furthermore, the memory controller 400 may control the operation of the memory chips 1000 by applying various types of signals, for example, a command and an address, adapted to control the memory chips 1000.

Furthermore, the memory controller 400 may provide data signals to the memory chips 1000 or receive data signals from the memory chips 1000 while communicating with the memory module 100.

The memory module 100 may include at least one rank 200, and the rank 200 may include a plurality of memory chips 1000. For example, each rank 200 may include nine memory chips 1000. Accordingly, the memory module 100 may include one or more memory chips 1000 that are mounted on a module board.

Each of the memory chips 1000 may include a memory cell array in which memory cells are arranged in the form of an array. The memory cell array may be divided into a plurality of regions. For example, the memory cell array may include one or more banks. Accordingly, the rank 200 may be divided into a plurality of banks, and each of the banks may be divided into one or more arrays. Furthermore, each of the banks 1110 may include a plurality of pages. A page may be defined as a unit that stores data transferred from the bank 1110 to a sense amplifier 1160 when a single activate command (ACT) is applied by the memory controller 400.

The memory chips 1000 may be dynamic random access memory (DRAM), such as double data rate synchronous dynamic random access memory (DDR SDRAM), graphics double data rate (GDDR) SDRAM, low power double data rate (LPDDR) SDRAM, Rambus dynamic random access memory (RDRAM), or the like.

Each of the memory chips 1000 may be used to store a data bit, a first parity bit, a position bit, and a second parity bit.

In this case, the data bit may refer to data that is stored in the memory chip 1000. Furthermore, the first parity bit may be information that is used to perform the first error correction of a data bit. Furthermore, the position bit has location information that allows a single data burst having an error to be extracted from a chunk including a plurality of data bursts, and includes information about the location of a single data burst having an error. Accordingly, the position bit may refer to information that enables a data burst, to which the first parity bit is to be applied, to be determined. Moreover, the second parity bit may be information that is used to perform the error correction of the position bit. In this case, the data burst may refer to a DRAM burst.

Furthermore, for example, the eight memory chips 1000 are used for data, and the ninth memory chip 2000 stores a third parity and is used for second error correction. In this case, the second error correction may be performed by the second ECC engine unit 300.

For example, the ninth memory chip 2000 may store a third parity bit that is used to correct the error of data read from at least one memory chip 1000. Accordingly, the memory system 10 may further include a third parity storage unit 2000.

Furthermore, the second ECC engine unit 300 may perform the second error correction using the data read from the at least one memory chip 1000 and the third parity bit corresponding to the read data. In this case, the second error correction performed by the second ECC engine unit 300 may be viewed as corresponding to "rank-level ECC" in that it is performed on a rank including one or more memory chips 1000.

According to an embodiment of the present invention, the memory system 10 may be applied to systems, such as a desktop, a notebook, a mobile device, etc., but is not limited thereto.

Figure 2:
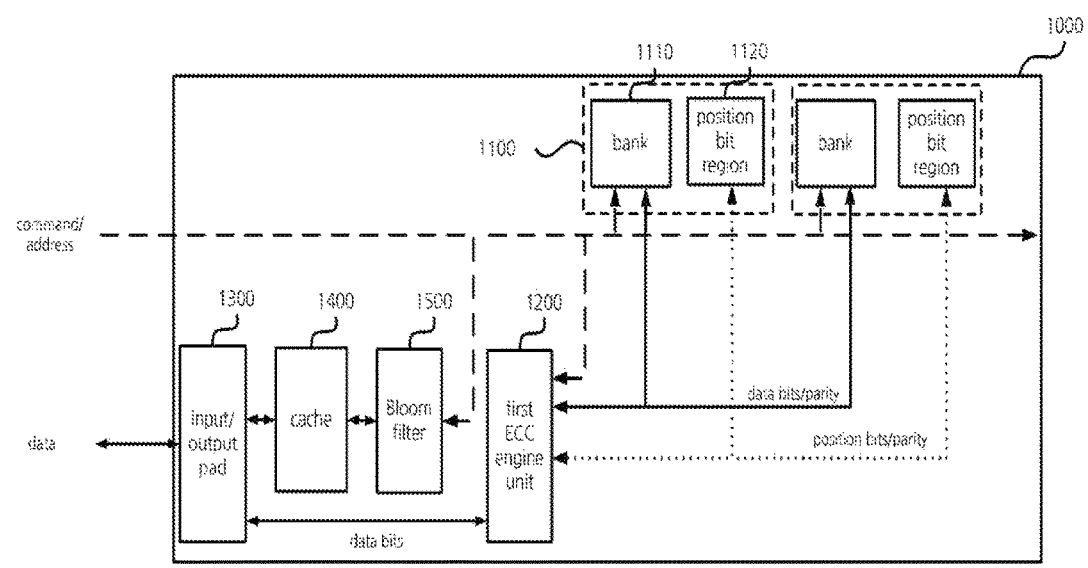
FIGS. 2 and 3 are block diagrams showing a memory chip according to an embodiment of the present invention.
Figure 3:
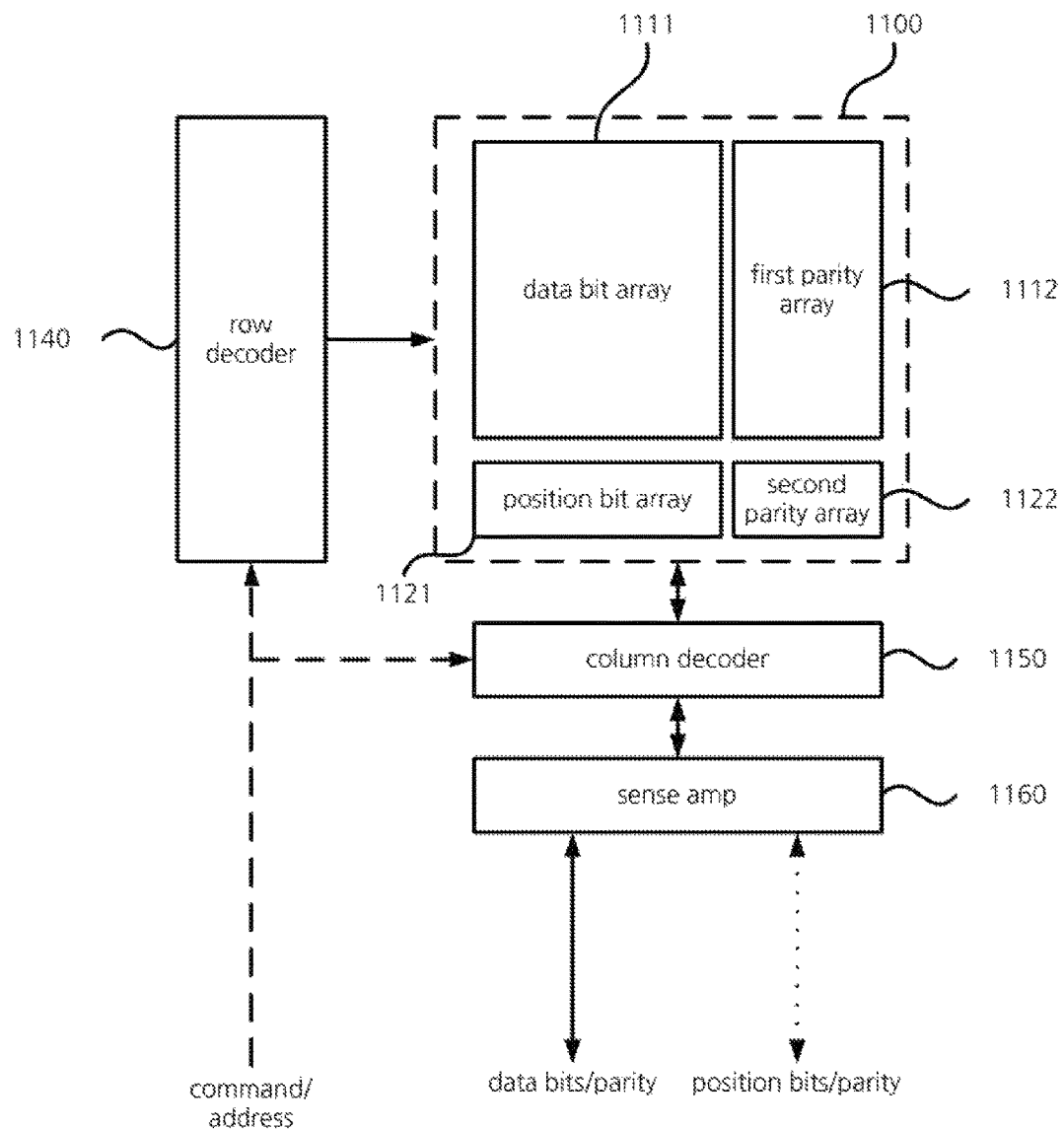

FIGS. 2 and 3 are block diagrams showing a memory chip 1000 according to an embodiment of the present invention.

The memory chip 100 according to an embodiment of the present invention may include at least one memory cell array 1100.

Furthermore, the memory cell array 1100 may include at least one bank 1110 in which a plurality of memory cells are arranged in rows and columns. A row decoder 1140 and a column decoder 1150 configured to select word lines and bit lines to be connected to the memory cells may be connected to each bank 1110.

Furthermore, the bank 1110 according to an embodiment of the present invention may include a data bit array 1111 and a first parity array 1112.

Meanwhile, the data bit array 1111 is an array configured to store data, and may include a plurality of first memory cells. The first parity array 1112 is an array configured to store a parity bit configured to perform the error correction of the data read from the data bit array 1111, and may include a plurality of second memory cells.

The first parity array 1112 according to an embodiment of the present invention may store first parity bits, used to repair faulty cells of first memory cells within the data bit array 1111, in a plurality of second memory cells. The faulty cells may refer to cells, such as a cell that does not permanently and completely operate due to a problem related to manufacture and a cell that does not operate under a specific voltage condition or at specific operation timing.

Meanwhile, the memory cell array 1100 may include a position bit region 1120. The position bit region 1120 is an array configured to store position bits, and may be composed of an independent array separate from the bank 1110.

The row decoder 1140 and the column decoder 1150 configured to select word lines and bit lines to be connected to memory cells may be connected to the position bit region 1120.

The position bit region 1120 may include a position bit array 1121 comprising a plurality of third memory cells, and configured to store position bits, i.e., the location information of one or more faulty cells of a plurality of first memory cells within the data bit array 1111.

For example, the position bits may store the location information of the faulty cells of the plurality of first memory cells in the position bit array 1121 when the memory system 10 operates. In this case, the position bit array 1121 may store position bits received from nonvolatile memory (not shown) configured to store position bits, i.e., the location information of the faulty cells of the first memory cells.

In this case, the size of the position bit array 1121 may be smaller than the size of the bank 1101. Accordingly, the read time required for the memory cell array 1100 may be reduced.

Furthermore, the position bit region 1120 may include a second parity array 1122 including a plurality of fourth memory cells, and configured to store the second parity bits used to repair one or more faulty cells of the third memory cells within the position bit array 1121.

Meanwhile, the row decoder 1140 and the column decoder 1150 according to an embodiment of the present invention may be shared by the bank 1110 and the position bit region 1120. For example, the position bit region 1120 is located adjacent to the bank 1110, and the position bits may be latched into the column decoder 1150 of the bank when the bank 1110 is activated in response to an activate command (ACT).

Meanwhile, the memory chip 1000 according to an embodiment of the present invention may include at least one sense amplifier 1160. The sense amplifier 1160 may be a global dataline sense amplifier (GDSA). The sense amplifier 1160 detects and amplifies a data bit, a first parity bit, a position bit, and a second parity bit that are read from the memory cell array.

Meanwhile, the memory chip 1000 according to an embodiment of the present invention may include a first ECC engine unit 1200. The first ECC engine unit 1200 may perform an ECC operation using first parity bits during the process of detecting/correcting error. In this case, the ECC operation performed by the first ECC engine unit 1200 may be viewed as corresponding to "in-DRAM ECC" in that it is performed inside the memory chip 1000.

Furthermore, the first ECC engine unit 1200 may compare an address applied by the memory controller 400 with position bits read from the position bit region with respect to a chunk including a plurality of data bursts read from the data bit array 1111, may detect a single error data burst from the plurality of data bursts included in the chunk, and may perform first error correction on the detected data burst.

For example, the first ECC engine unit 1200 may read a plurality of data bursts from the data bit array 1111. In this case, the first ECC engine unit 1200 may group the plurality of data bursts into a single chunk.

Furthermore, the parity bits used to perform error correction on a data burst having an error may be read from the first parity array 1112 to the first ECC engine unit 1200.

Furthermore, the position bits may be read from the position bit array 1121 to the first ECC engine unit 1200.

In this case, the first ECC engine unit 1200 specifies the single data burst having an error in the chunk by comparing an address and a position bit applied from the outside. That is, the position bit may be compared with the address in order to determine whether the first parity bit is to be applied to the data burst. Accordingly, the first ECC engine unit 1200 may perform first error correction using only a single data burst, a single parity bit, and a single position bit.

Accordingly, from the point of view of the memory controller 400, when a data command and an address are applied, the memory controller 400 has encoding/decoding latency (coding latency) for error correction for a specific location. The first ECC engine unit 1200 performs remapping when a data burst, to which a parity bit determined by a position bit will be applied, corresponds to the specific location, thereby fetching encoding and decoding latency for error correction.

For example, the memory controller 400 may provide extra access latency to a data burst when the memory controller 400 knows the corresponding data burst requiring extra coding latency for in-DRAM ECC. If the memory controller 400 fixes a location for a data burst to which extra access latency is to be provided, the extra access latency is provided when a burst having the fixed location is accessed, and the first ECC engine unit 1200 matches a data burst, to which a parity bit determined by the position bit is to be applied, to access to the burst having the fixed location, thereby ensuring extra coding latency.

Furthermore, the first ECC engine unit 1200 may perform first error correction based on single error correction, double error detection (SECDED) Hamming codes. In this case, although the size of a chunk may be as large as the size of a bank, the size of the chunk may be limited to the row size of the data bit array 1111 so that a data burst and a parity bit are prepared in a bit line sense amplifier (BLSA) after a row has been activated in response to an activate command.

Furthermore, the first ECC engine unit 1200 may perform first error correction by applying double error correction (DEC). Accordingly, the error may be corrected in the data burst of the chunk that is specified by the position bit. If a single-bit error occurs in the remaining bursts, the second ECC engine unit 300 may correct the error.

Meanwhile, the memory chip 1000 according to an embodiment of the present invention may include input and output pads 1300. Accordingly, data stored in each memory cell may be input and output via a corresponding input and output pad.

Meanwhile, the memory chip 1000 according to an embodiment of the present invention may include a cache 1400. The cache 1400 may store the addresses of one or more faulty cells of a plurality of memory cells, and may store data corresponding to the addresses of the faulty cells.

The cache 1400 may include a cache tag array (not shown) configured to store the addresses of one or more faulty cells of a plurality of memory cells. Furthermore, the cache 1400 may include a cache data array (not shown) configured to store data stored at the addresses of the faulty cells of the first memory cells.

Accordingly, the cache 1400 may receive an address from the memory controller 400, and may output data corresponding to the address of a faulty cell stored in the cache data array if the received address matches the address of the faulty cell stored in the cache tag array and thus the address of a data burst including error data is accessed. Accordingly, since the cache 1400 and the bank 1110 may be accessed in parallel, the latency of a DRAM operation may not be increased.

Furthermore, the cache 1400 may be located more adjacent to the input and output pads 1300 than to the bank 1110.

Meanwhile, the memory chip 1000 according to an embodiment of the present invention may include a Bloom filter 1500. The Bloom filter 1500 may be use to determine whether an address applied by the memory controller 400 corresponds to the address of a faulty cell.

For example, the Bloom filter 1500 may use N independent hash functions that convert an input number into another number within a limited range R. Furthermore, the Bloom filter 1500 may has static random access memory (SRAM) storage (not shown) composed of R bits. The individual bits may be set to 0 in an initial stage, and thus may be cleared. Thereafter, the Bloom filter 1500 may execute a hash function for an address including a known faulty cell, and may set a bit, at the location of the SRAM storage (not shown) corresponding to a hash value, to 1. Accordingly, the Bloom filter 1500 may apply a hash function to an applied address, may check a location corresponding to a hash value, and may determine that the applied address is not an address including a faulty cell if a bit value at the corresponding location is 0 and determine that the applied address may be an address including a faulty cell if a bit value at the corresponding location is 1.

Figure 4:
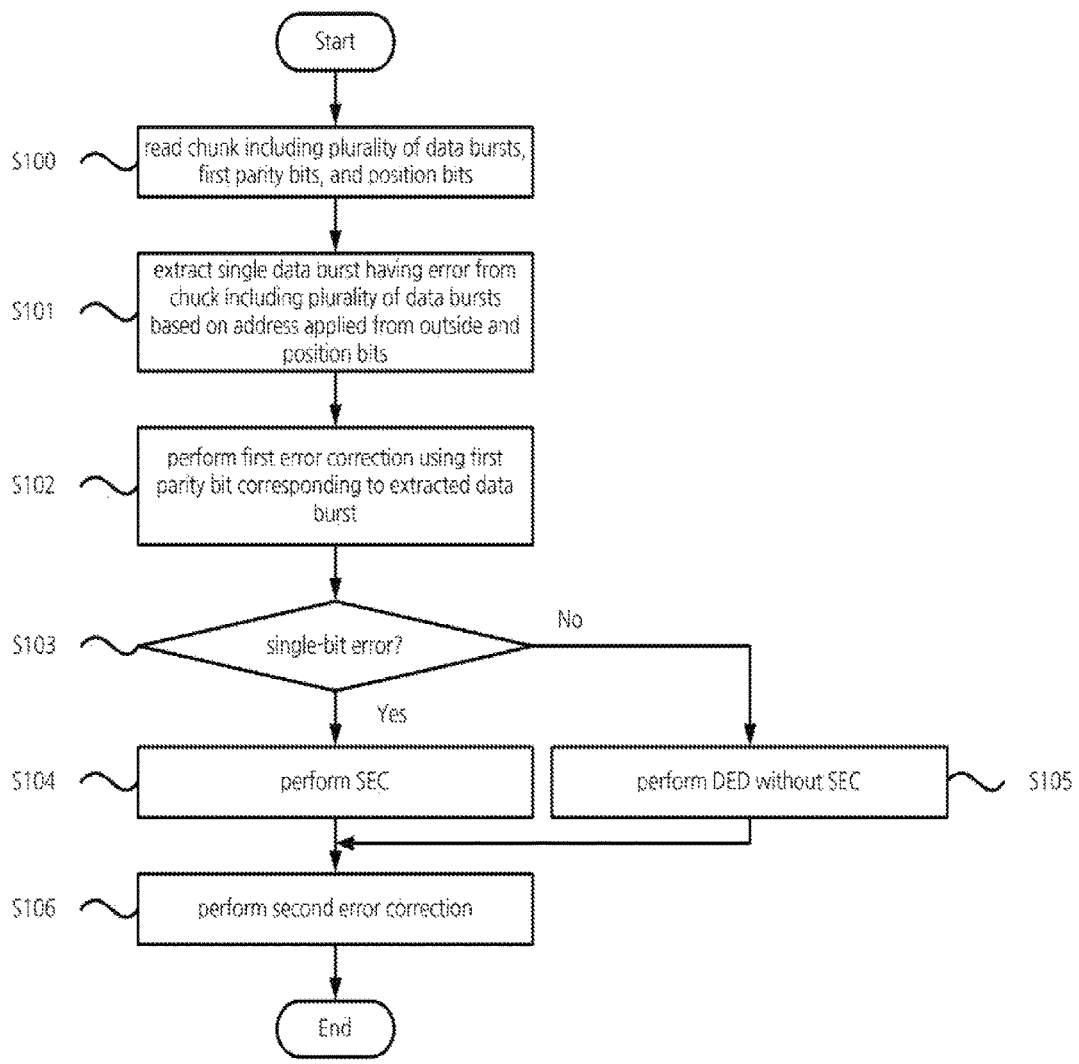
FIG. 4 is a flowchart illustrating a method for the error correction of memory according to an embodiment of the present invention.

In contrast, a method for the error correction of memory according to an embodiment shown in FIG. 4 includes steps that are processed in time series in the memory system 10 shown in FIGS. 1 to 3. Accordingly, descriptions that are omitted in the following description but have been described above with reference to the memory system 10 shown in FIGS. 1 to 3 may be applied to the method for the error correction of memory according to the embodiment shown in FIG. 4.

The memory system 10 according to an embodiment of the present invention may read a chunk including a plurality of data bursts, first parity bits and position bits from a plurality of memory chips at step S100.

For example, the data bit array 1111, the first parity bit array 1112, the position bit array 1121 and the second parity bit array 1122 may share the row decoder 1140 and the column decoder 1150. Accordingly, it may be possible to receive an activate command and an address from the memory controller 400, to allow a position bit corresponding to the received address to be latched into the column decoder 1150 when the bank 1110 corresponding to the corresponding row address is activated, and to allow the position bit to be used for a read command RD or a write command WR.

Furthermore, the memory system 10 allows a chunk including a plurality of data bursts, first parity bits and position bits to be read from the plurality of memory chips 1000 to the first ECC engine unit 1200 included in each of the plurality of memory chips 1000.

Meanwhile, a single data burst having an error may be extracted from the chunk including a plurality of data bursts by comparing an address, applied from the outside by the first ECC engine unit 1200 included in the memory system 10 according to an embodiment of the present invention, with the read position bits at step S101.

Meanwhile, the first ECC engine unit 1200 included in the memory system 10 according to an embodiment of the present invention may perform first error correction on the extracted data burst using a corresponding first parity bit at step S102.

For example, the first error correction may be performed using DEC or SECDED.

If the first error correction is performed based on single-bit error correction (SEC) code, a situation may occur in which the error cannot be corrected during second error correction performed by the second ECC engine unit 300 and an error cannot be detected may occur. That is, interference between in-DRAM ECC and rank-level ECC.

For example, in the case where a 2-bit error occurs in a data burst, when first error correction is performed based on SEC code having a Hamming distance of 3, the first ECC engine unit 1200 may recognize a codeword having a single-bit error and then perform error correction. Accordingly, a bit having no error may be corrected to a bit having an error, with the result that a 3-bit error may be generated. Therefore, a situation may occur in which the second ECC engine unit 300 can neither correct the error nor detect an error.

Accordingly, after extracting the data burst having an error, the memory system 10 according to an embodiment of the present invention may determine whether the extracted data has a single-bit error at step S103. For example, when the first ECC engine unit 1200 performs error correction based on SECDED Hamming codes, it may be determined whether the extracted data has a single-bit error.

Furthermore, the first ECC engine unit 1200 included in the memory system 10 according to an embodiment of the present invention may perform single bit correction if the extracted data burst corresponds to a single-bit error at step S104.

Furthermore, the first ECC engine unit 1200 included in the memory system 10 according to an embodiment of the present invention may perform DED and first error correction without performing SEC if the extracted data burst corresponds to a double-bit error at step S105. Accordingly, when a double bit error is detected based on DED, single-bit error correction is not performed, and thus a normal bit may be prevented from being erroneously corrected. Furthermore, the second ECC engine unit 300 performs double-bit error detection, and thus a situation in a double-bit error cannot be found can be prevented. Therefore, interference between in-DRAM ECC and rank-level ECC can be prevented.

Meanwhile, the second ECC engine unit 300 included in the memory system 10 according to an embodiment of the present invention may receive data having undergone first error correction from the plurality of memory chips 1000 included in the memory system 10, and may perform second error correction based on the received data and the third parity bits at step S106.

For example, the plurality of memory chips 1000 may output data having undergone first error correction, and the second ECC engine unit 300 may perform second error correction based on the output data and the third parity bits output from the third parity storage unit.

According to at least one embodiment of the present invention, interference between in-DRAM ECC and rank-level ECC can be prevented.

According to at least one embodiment of the present invention, the area overhead of a memory chip can be reduced by executing ECC using a position bit.

According to at least one embodiment of the present invention, a memory system capable of improving the reliability of memory can be provided.

The above-described detailed description of the present invention is merely illustrative, and it will be understood that those having ordinary knowledge in the art to which the present invention pertains can easily make modifications and variations without departing from the technical spirit and essential features of the present invention. Therefore, the above-described embodiments are illustrative in all aspects, and are not limitative. For example, each component described as being in a single form may be practiced in a distributed form. In the same manner, components described as being in a distributed form may be practiced in an integrated form.

The scope of the present invention is defined by the attached claims, rather than the detailed description. Furthermore, all modifications and variations derived from the meanings, scope and equivalents of the claims should be construed as falling within the scope of the present invention.

What is claimed is:
1. A memory system comprises:
at least one memory chip comprising:
a bank comprising:
a data bit array comprising a plurality of first memory cells; and
a first parity array comprising a plurality of second memory cells, and configured to store first parity bits in the plurality of second memory cells to repair one or more faulty cells of the first memory cells of the data bit array;

a position bit region comprising a position bit array comprising a plurality of third memory cells, and configured to store position bits, which include location information of the faulty cells of the plurality of first memory cells of the data bit array; and a first ECC engine unit configured to compare an address, applied from an outside, with the position bits read from the position bit region with respect to a chunk including a plurality of data bursts read from the data bit array, to detect a single error data burst from the plurality of data bursts included in the chunk, and to perform first error correction on the detected data burst;

a third parity storage unit configured to store third parity bits for data output by the at least one memory chip and having undergone the first error correction; and a second ECC engine unit configured to perform second error correction using the output data and the third parity bit corresponding to the output data, the first ECC engine unit being adapted to perform the first error correction by performing double-bit error detection (DED) if the detected single error data burst corresponds to double-bit error, and the second ECC engine unit being adapted to perform the second error correction by performing the DED if the detected single error data burst corresponds to double-bit error.

2. The memory system of claim 1, wherein:

the position bit region comprises a second parity array comprising a plurality of fourth memory cells, and configured to store second parity bits, adapted to repair the faulty cells of the plurality of third memory cells within the position bit array, in the plurality of fourth memory cells; and the first ECC engine unit performs an operation of repairing errors of the position bits using the second parity bits.

3. The memory system of claim 1, wherein the first ECC engine unit performs the first error correction while a size of the chunk is limited to row size of the data bit array.

4. The memory system of claim 1, wherein the at least one memory chip further comprises a row decoder and a column decoder that are shared by the bank and the position bit region.

5. The memory system of claim 4, wherein the position bits are latched into the column decoder when the bank is activated in response to an activate command.

6. The memory system of claim 1, wherein:

the memory system further comprises nonvolatile memory configured to store the position bits which include the location information of the faulty cells of the first memory cells; and the position bit array stores the position bits previously stored in the nonvolatile memory.

7. The memory system of claim 1, wherein the first ECC engine unit performs the first error correction based on single error correction, double error detection (SECDED) Hamming codes.

8. The memory system of claim 1, wherein the second ECC engine unit performs the second error correction based on SECDED Hamming codes.

9. The memory system of claim 1, wherein the memory chip further comprises caches configured to store addresses of the faulty cells of the plurality of memory cells, and to store data corresponding to the addresses of the faulty cells.

10. The memory system of claim 1, wherein the memory chip further comprises a Bloom filter configured to apply a hash function to an applied address, to check a location corresponding to a hash value, and to determine whether the applied address is an address, including a faulty cell, based on a bit value at the location corresponding to the hash value.

11. A method for error correction of memory, the method being performed by a memory system including a plurality of memory chips, the method comprising:

reading, by a first ECC engine unit included in each of the plurality of memory chips, a chunk including a plurality of data bursts, first parity bits, and position bits from each of the plurality of memory chips;

extracting, by the first ECC engine unit, a single data burst having an error from the plurality of data bursts using the position bits;

performing, by the first ECC engine unit, first error correction using the first parity bit corresponding to the extracted error data burst;

outputting, by each of the plurality of memory chips, data having undergone the first error correction;

storing third parity bits for the output data; and performing second error correction based on the output data and the third parity bits, wherein the performing of the first error correction comprises performing double-bit error detection (DED) if the extracted data burst corresponds to double-bit error, and wherein the performing of the second error correction comprises performing the DED if the extracted data burst corresponds to double-bit error.

12. The method of claim 11, wherein extracting, by the first ECC engine unit, the single data burst having the error from the plurality of data bursts using the position bits comprises extracting, by the first ECC engine, the single data burst having the error from the plurality of data bursts by comparing an address applied from an outside with the position bits.

13. The method of claim 11, wherein performing the first error correction comprises performing single-bit error correction (SEC) if the extracted data burst corresponds to a single-bit error.

* * * * *